United States Patent
Buchanan et al.

(10) Patent No.: US 10,418,810 B2
(45) Date of Patent: Sep. 17, 2019

(54) ELECTROSTATIC DISCHARGE MEMRISTIVE ELEMENT SWITCHING

(71) Applicant: Hewlett Packard Enterprise Development LP, Houston, TX (US)

(72) Inventors: Brent Buchanan, Palo Alto, CA (US); Richard J. Auletta, Fort Collins, CO (US); Ning Ge, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 254 days.

(21) Appl. No.: 15/540,192

(22) PCT Filed: Jan. 28, 2015

(86) PCT No.: PCT/US2015/013222
§ 371 (c)(1),
(2) Date: Jun. 27, 2017

(87) PCT Pub. No.: WO2016/122473
PCT Pub. Date: Aug. 4, 2016

(65) Prior Publication Data
US 2018/0006449 A1    Jan. 4, 2018

(51) Int. Cl.
*H02H 9/04* (2006.01)
*G11C 13/00* (2006.01)
(Continued)

(52) U.S. Cl.
CPC ..... *H02H 9/046* (2013.01); *H01L 21/823475* (2013.01); *H01L 27/0266* (2013.01);
(Continued)

(58) Field of Classification Search
CPC . H02H 9/046; H01L 27/0288; H01L 27/0266; H01L 45/1608; H01L 21/823475
(Continued)

(56) References Cited

U.S. PATENT DOCUMENTS 5,995,354 A    11/1999  Yu
6,809,522 B2   10/2004  Nguyen
(Continued)

FOREIGN PATENT DOCUMENTS

EP    1903765 A2    3/2008

OTHER PUBLICATIONS

Elmer G., et al.; "Possible application of memristors in ESD protection". Journal of Electrostatics. Elsevier Science Publishers B.V. Amsterdam. NL. vol. 71. No. 3, Nov. 30, 2012. pp. 373-376. XP028525039. ISSN: 0304-3886. DOI: 10.1016/J.ELSTAT.2012. 11.008.

(Continued)

*Primary Examiner* — Thienvu V Tran
*Assistant Examiner* — Lucy M Thomas
(74) *Attorney, Agent, or Firm* — Hewlett Packard Enterprise Patent Department

(57) ABSTRACT

In the examples provided herein, an electrostatic discharge (ESD) recording circuit has a first memristive element coupled to a pin of an integrated circuit. The first memristive element switches from a first resistance to a second resistance when an ESD event occurs at the pin, and the first resistance is less than the second resistance. The ESD recording circuit also has shunting circuitry to shunt energy from an additional ESD event away from the first memristive element.

15 Claims, 8 Drawing Sheets

(51) Int. Cl.
*H01L 27/02* (2006.01)
*H01L 45/00* (2006.01)
*H01L 27/092* (2006.01)
*H01L 21/8234* (2006.01)
*G11C 29/50* (2006.01)

(52) U.S. Cl.
CPC ...... H01L 27/0288 (2013.01); H01L 45/1608 (2013.01); *G11C 13/004* (2013.01); *G11C 13/0097* (2013.01); *G11C 2029/5002* (2013.01); *H01L 27/092* (2013.01)

(58) Field of Classification Search
USPC .......................................................... 361/56
See application file for complete search history.

(56) References Cited

U.S. PATENT DOCUMENTS

| | | | |
|---|---|---|---|
| 6,813,122 | B1 | 11/2004 | Garnstrom |
| 6,819,539 | B1* | 11/2004 | Wright ...................... G06F 1/30 361/90 |
| 7,142,400 | B1* | 11/2006 | Williams ................ G06F 1/305 361/18 |
| 7,218,491 | B2* | 5/2007 | Jaussi ................. H01L 27/0251 361/111 |
| 2008/0074817 | A1 | 3/2008 | Crain et al. |
| 2009/0091870 | A1 | 4/2009 | Huang et al. |
| 2010/0225347 | A1 | 9/2010 | Worley et al. |
| 2011/0285309 | A1* | 11/2011 | Van De Ven ...... H05B 33/0809 315/291 |
| 2014/0191778 | A1 | 7/2014 | DeForge et al. |
| 2014/0347072 | A1* | 11/2014 | Herrmann ............ G01R 35/005 324/601 |
| 2015/0053908 | A1* | 2/2015 | Fowler .................... H01L 45/04 257/4 |

OTHER PUBLICATIONS

International Searching Authority, The International Search Report and the Written Opinion, dated Sep. 30, 2015, PCT/US2015/013222, 10 Pages.

Ker, M.-D., et al., On-Chip ESD Detection Circuit for System-Level ESD Protection Design, Nov. 1-4, 2010, Solid-State and Integrated Circuit Technology (ICSICT), 2010 10th IEEE International Conference, IEEE, pp. 1584-1587.

* cited by examiner

```
800
```

Form a memristive element as part of an integrated circuit
805

Form a resistive element in parallel with the memristive element as part of the integrated circuit, wherein a first terminal of the memristive element and a first terminal of the resistive element are coupled at a first node, and a second terminal of the memristive element and a second terminal of the resistive element are coupled at a second node
810

Form a first transistor as part of the integrated circuit, wherein a drain terminal of the first transistor is coupled to the second node, and further wherein a gate terminal and a source terminal of the first transistor are coupled to ground
815

Couple a pin of the integrated circuit to the first node
820

Form a second transistor as part of the integrated circuit
825

ELECTROSTATIC DISCHARGE MEMRISTIVE ELEMENT SWITCHING

BACKGROUND

An integrated circuit (IC) is a group of miniaturized electronic components fabricated on a substrate of semiconductor material, such as silicon. An IC can be microscopic in size. In fact, an IC the size of a dime can have billions of transistors and other types of electronic components.

Electrostatic discharge (ESD) can damage or destroy components of an IC. ESD occurs when an accumulated electric charge is shorted to a lower potential. There are many situations in which an ESD event can arise for an IC, for example, when a charged body touches the IC and when a charged IC touches a grounded element. When the electric charge moves between surfaces, it becomes a current that can damage the IC.

BRIEF DESCRIPTION OF THE DRAWINGS

The accompanying drawings illustrate various examples of the principles described below. The examples and drawings are illustrative rather than limiting.

FIG. 8 depicts a flow diagram illustrating an example process of manufacturing a memristive element as part of an integrated circuit for detecting whether an electrostatic event occurred at a pin of the integrated circuit.

DETAILED DESCRIPTION

Electrostatic discharge (ESD) may occur without warning and may arise in manufacturing and operating environments. ESD protection circuits have been developed to shunt ESD currents away from circuits in an integrated circuit (IC) that would otherwise be damaged by the discharge. However, ESD protection circuits may not be totally reliable because they may turn on too late, trigger at a voltage that is too high to protect the IC, or fail during the occurrence of an ESD. Further, a single ESD pulse may be insufficiently strong to damage the IC, as determined through functional testing of the IC. But if the IC is subjected to multiple weak ESD pulses, the IC may be degraded more with each pulse, ultimately resulting in catastrophic failure. It would be beneficial to know when an IC has experienced an ESD event, independent of whether the ESD event was strong enough to cause, immediately measurable damage. One way to do so is to use at least one memristive element to record the occurrence of an ESD event at each pin of an IC. This technique may be applied to any type of IC.

A memristive element may switch between two or more stags, for example, a low resistance state (LRS) and a high resistance state (HRS). With a bipolar memristive element, when voltage is applied to the element in one direction, the element is set to the LRS, and when voltage is applied to the element in the opposite direction, the element is set to the HRS. With a unipolar memristive element, when voltage of a first magnitude is applied to the element, the element is set to the LRS, and when voltage of a second, different magnitude is applied to the element in the same direction, the element is set to the HRS. In both cases, the memristive element remains in the HRS until subsequent switching to the LRS is triggered by the application of a switching voltage or current to the memristive element. Thus, by coupling a memristive element to each pin of an IC, the memristive elements may be able to record the occurrence of an ESD event at each pin, respectively.

Figure 1:
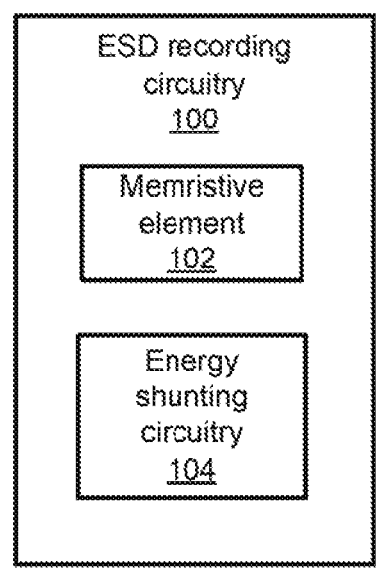
FIG. 1 depicts a block diagram of an example electrostatic discharge recording circuitry including a memristive element for detecting an electrostatic discharge event.

FIG. 1 depicts a block diagram of an example electrostatic discharge recording circuitry 100 including a memristive element 102. The memristive element 102 of FIG. 1 may be coupled to a pin of an integrated circuit (IC) and used to detect and record the occurrence of an electrostatic discharge (ESD) event at the pin, The memristive element 102 may be initially set to a first resistance prior to being used to detect an ESD event. Then when an ESD event occurs at the pin of the IC, the memristive element 102 allows current to pass through and absorbs the energy of the ESD event. When the voltage of the ESD event is large enough to trigger the memristive element 102 to switch resistance states, the memristive element 102 switches to a second resistance. The first resistance is less than the second resistance.

The example circuitry 100 of FIG. 1 also includes shunting circuitry 104 to shunt energy away from the memristive element 102 after the memristive element 102 switches from the first resistance to the second resistance. After the memristive element 102 has switched to the higher second resistance, the memristive element 102 no longer allows as much current to pass through, thus most of the current is shunted away from the memristive element 102 by the shunting circuitry 104. If the memristive element 102 is not reset to the first resistance by the application of a switching voltage, the memristive element 102 remains at the second resistance after the ESD event occurs. As a result, the resistance of the memristive element 102 may be read to determine whether the memristive element 102 coupled to the pin of the IC experienced an ESD event. For example, if the resistance of the memristive element 102 is determined to be the first resistance, it may be concluded that no ESD event has occurred. However, if the resistance of the memristive element 102 is determined to be the second resistance, this is an indication that the memristive element 102 has experienced an ESD event, and thus, the circuitry of the IC has been exposed to the ESD event. An electrical reading circuit (not shown) may be used to determine the resistance of the memristive element 102.

The shunting circuitry 104 also shunts energy from an additional, subsequent ESD event, after the first ESD has occurred, away from the memristive element 102 because the memristive element 102 has switched to the second resistance and passes very little current. In some examples, the shunting circuitry 104 may include a first resistive element in parallel with the memristive element 102 that has a third resistance greater than the first resistance and less than the second resistance. Further, the resistance of the memristive element 102 may be maintained at the second resistance after switching from the first resistance until the resistance is reset to the first resistance.

In some instances, once the memristive element 102 has been read and determined to be the second resistance, the memristive element 102 may be reset to the first resistance by applying a reset voltage to the memristive element 102 via an electrical writing circuit (not shown). As the occurrence of an ESD event at any of the pins of an IC may be deleterious to the IC, the IC should be tested prior to resetting the memristive element 102 to the first resistance. Further, as testing may not show an immediate indication of damage, the lifetime of the IC may be shortened by the occurrence of the ESD event, and it may be appropriate to discard the IC or take other appropriate measures, such as binning the ICs based on the number of ESD events recorded for the IC.

Figure 2:
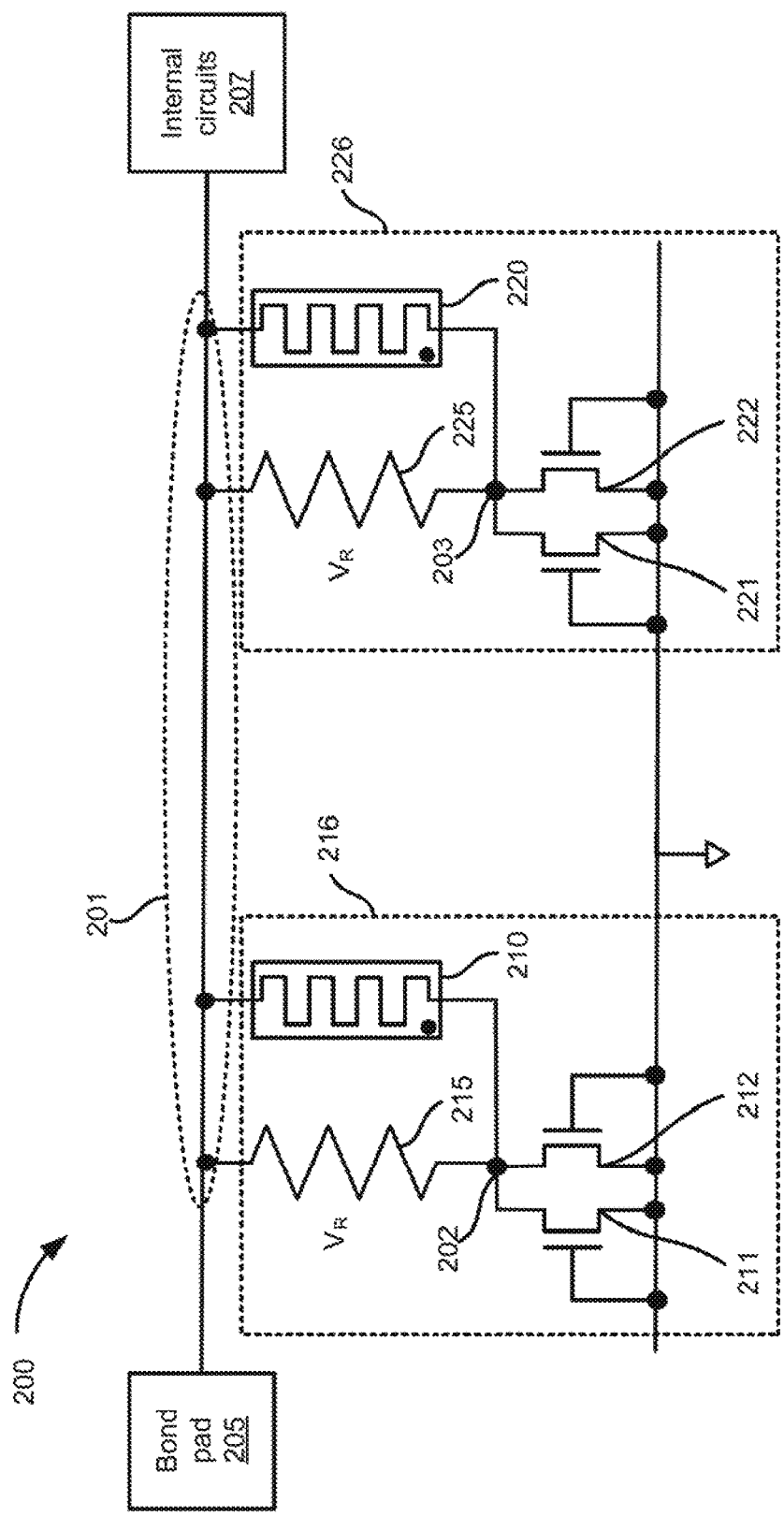
FIG. 2 depicts an example ESD recording circuit including mememristive element for detecting an electrostatic discharge event.

FIG. 2 depicts an example ESD recording circuit 200 including, memristive elements 210, 220 for detecting an electrostatic discharge event. The ESD recording circuit 200 includes a first memristive element 210 coupled to a pin of an IC via bond pad 205, where the chip pin may be wire-bonded to the bond pad 205. The first memristive element 210 switches from a first resistance to a second resistance when an ESD event occurs at the pin, where the first resistance is less than the second resistance.

The ESD recording circuit 200 also includes shunting circuitry to shunt energy away from the first memristive element 210. In some instances, the shunting circuitry includes a first resistive element 215 in parallel with the first memristive element 210, where the first resistive element 215 has a third resistance greater than the first resistance and less than the second resistance. A first terminal of the first memristive element 210 and a first terminal of the first resistive element 215 are coupled at a first node 201, and a second terminal of the first memristive element 210 and a second terminal of the first resistive element 215 are coupled at a second node 202. The chip pin that the ESD recording circuit 200 monitors for the occurrence of an ESD event is coupled via the bond pad 205 to the first node 201, and the internal circuits 207 of the integrated circuit to be protected from the ESD event are also coupled to the first node 201.

The ESD recording circuit 200 further includes a first transistor 211. A first drain terminal of the first transistor 211 is coupled to the second node 202. Additionally, a first gate terminal and a first source terminal of the first transistor 211 are coupled to ground.

In some instances, as shown in the example of FIG. 2, the ESD recording circuit 200 may also include a second transistor 212. A second drain terminal of the second transistor 212 is coupled to the second node 202, and a second gate terminal and a second source terminal of the second transistor 212 are coupled to ground. Additional transistors can be added in parallel to the first transistor 211 and the second transistor 212 to provide additional paths to ground for the shunted current.

In some instances, as shown in the example of FIG. 2, the ESD recording circuit 200 can further include a second memristive element 220, a second resistive element 225, and a third transistor 221. The second memristive element 220 and the second resistive element 225 are in parallel and coupled to the first node 210 and a third node 203. A third drain terminal of the third transistor 221 is coupled to the third node 203, and a third gate terminal and a third source terminal of the third transistor 221 are coupled to ground. Further transistors, such as transistor 222, can be coupled in parallel to the third transistor 221.

Additional sub-circuits, such as sub-circuit 216, 226 denoted in FIG. 2 and described above, can be included in the ESD recording circuit 200.

Looking at sub-circuit 216, the first memristive element 210 may be initially set to a low resistance state (LRS). When an ESD event occurs at bond pad 205, current flows through the first memristive element 210 and the first resistive element 215, causing a voltage $V_R$ to develop across this pair of elements 210, 215. The application of the voltage $V_R$ switches the memristive element 210 from the LRS to the high resistive state (HRS), causing most of the current flow to be shunted through the first resistive element 215. The resistance value of the LRS should be less than the resistance value of the first resistive element 215 so that most of the current initially flows through the first memristive element 210 to switch the memristive element 210 to the HRS as soon as possible.

The first transistor 211 and the second transistor 212 are grounded-gate transistors. If either the first transistor 211 or the second transistor 212 overdraw current, then more current flows through the first resistive element 215, causing the voltage drop $V_R$ across the first resistive element 215 to increase. As a result, less voltage is available across the drain and collector terminals of the first transistor 211, causing the local current drawn by the first transistor 211 to decrease. Sub-circuit 226 operates in a similar manner to sub-circuit 216.

Thus, the shunting circuitry provides a mechanism for spreading out the charge from the ESD over multiple grounded ate transistors. As a result, the ESD current is prevented from passing through a single grounded-gate transistor which may destroy the transistor with excessive heat.

Figure 3:
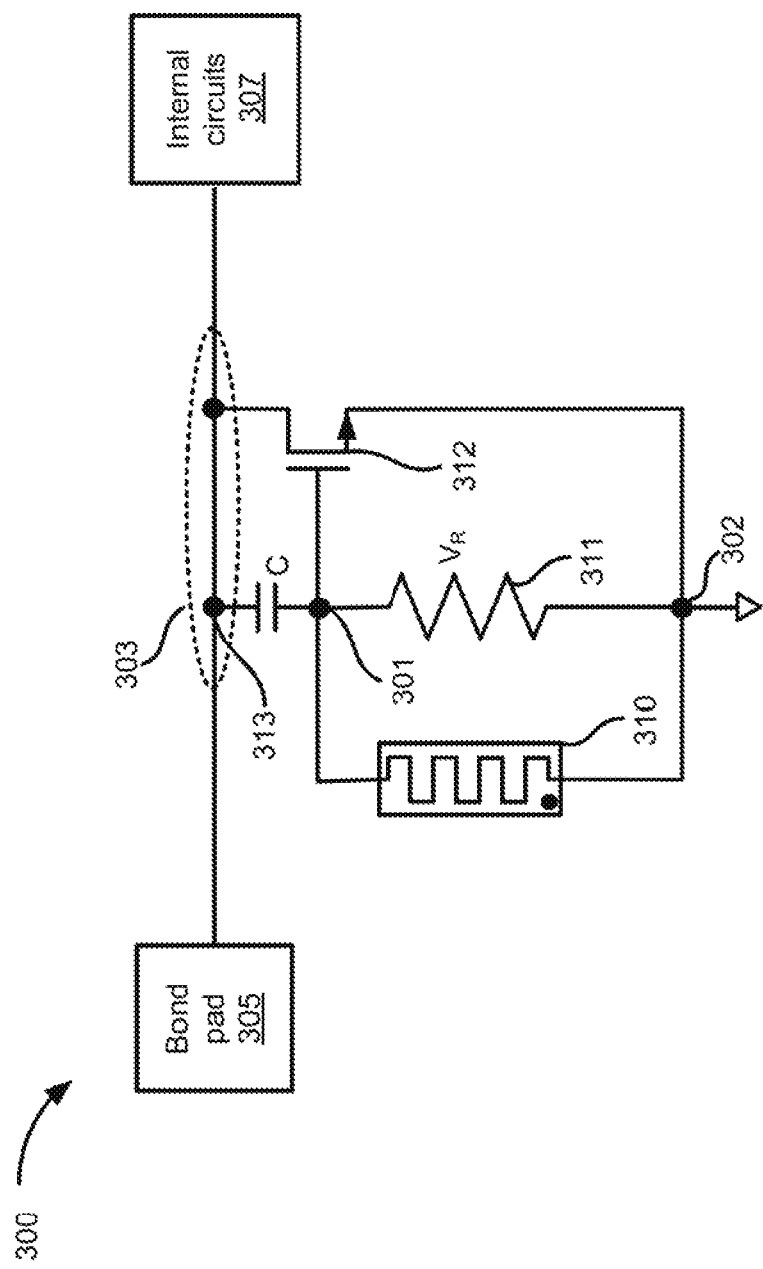
FIG. 3 depicts an example ESD recording circuit including a memristive element for detecting an electrostatic discharge event.

FIG. 3 depicts an example ESD recording circuit 300 including a memristive element 310 for detecting an electrostatic discharge event. As with the example of FIG. 1, the ESD recording circuit 300 includes a first memristive element 310 coupled to a pin of an IC via bond pad 305, where the chip pin may be wire-bonded to the bond pad 305. The first memristive element 310 switches from a first resistance to a second resistance when an ESD event occurs at the pin, where the first resistance is less than the second resistance.

The ESD recording circuit 300 also includes shunting circuitry to shunt energy away from the first memristive element 310. In some instances, the shunting circuitry includes a first resistive element 311 in parallel with the first memristive element 310. The first resistive element 311 has a third resistance greater than the first resistance and less than the second resistance. The ESD recording circuit 300 further includes a capacitor 313 and a transistor 312.

A first terminal of the first memristive element 310 and a first terminal of the first resistive element 311 are coupled at a first node 301, and a second terminal of the first memristive element 310 and a second terminal of the first resistive element 311 are coupled at a second node 302, and the second node is coupled to ground. Further, a first terminal of the capacitor 313 and a gate terminal of the transistor 312 are coupled to the first node 301. Additionally, the source terminal of the transistor 312 is coupled to ground, and the drain terminal of the transistor 312 is coupled to a second terminal of the capacitor 313 at a third node 303. The IC pin that the ESD recording circuit 300 monitors for the occurrence of an ESD event is coupled via the bond pad 305 to the third node 303, and the internal circuits 307 of the integrated circuit to be protected from the ESD event are also coupled to the third node 303.

The first memristive element 310 of FIG. 3 may be initially set to a low resistance state (LRS). When an ESD event occurs at bond pad 305, the steep high voltage edge of the ESD pulse generates a current pulse through the capacitor 313. The current is given by: C dV/dt, where C is the capacitance of capacitor 313, and dV/dt is the change in voltage over time across the capacitor 313. The current flows through the first memristive element 310 and the first resistive element 311 causing a voltage $V_R$ to be generated across this pair of elements 310, 311. As seen with the example circuit in FIG. 2, the application of the voltage $V_R$, switches the memristive element 310 from the LRS to the high resistive state (HRS), causing most of the current flow to be shunted through the first resistive element 311. The voltage $V_R$ is applied to the gate of the transistor 312 which turns it on, and the transistor 312 drains away the ESD charge.

Figure 4:
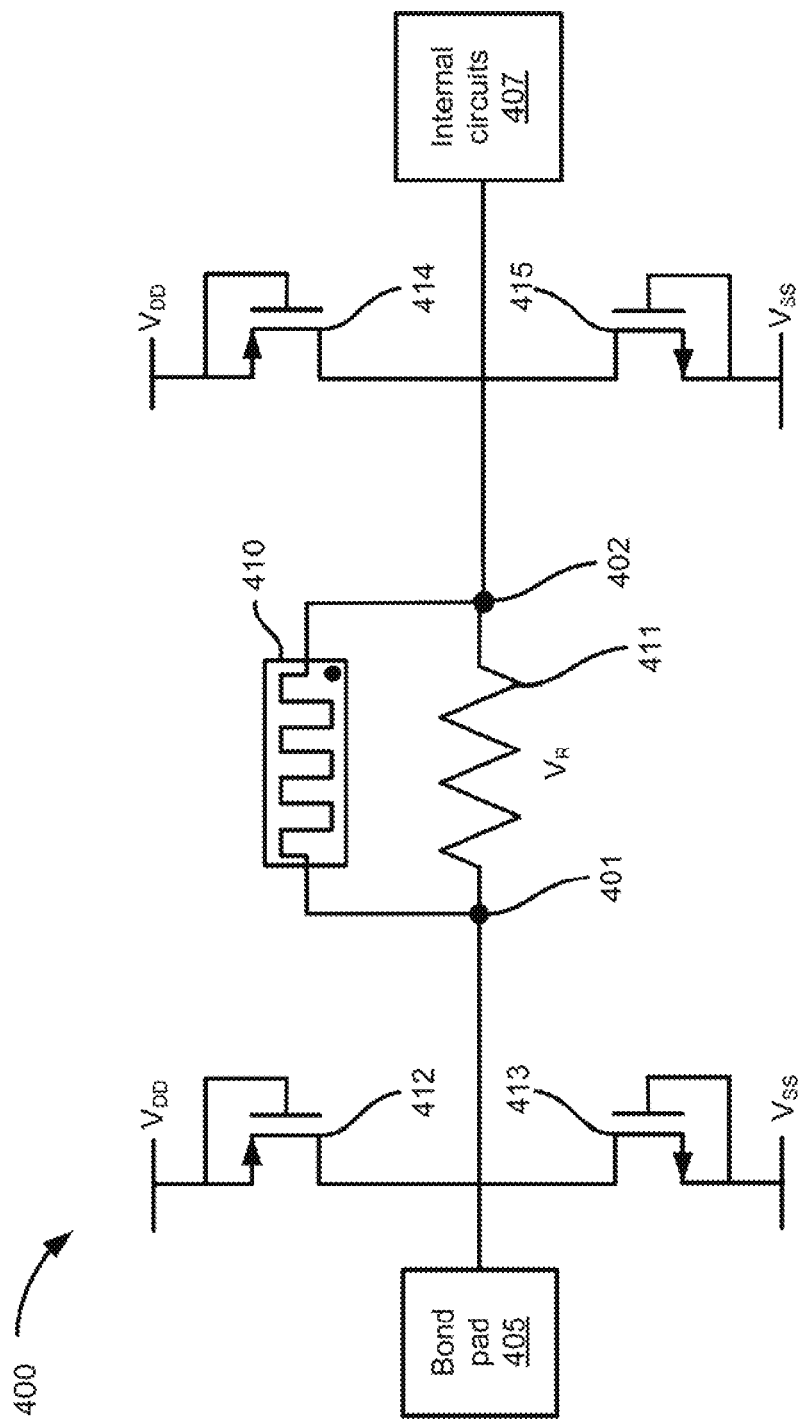
FIG. 4 depicts an example ESD recording circuit of an example system including a memristive element for detecting an electrostatic discharge event.

FIG. 4 depicts an example ESD recording circuit 400 including a memristive element 410 for detecting an electrostatic discharge event, As with the example of FIG. 1, the ESD recording circuit 400 includes a first memristive element 410 coupled to a pin of an IC via bond pad 405, where the chip pin may be wire-bonded to the bond pad 405. The first memristive element 410 switches from a first resistance to a second resistance when an ESD event occurs at the pin, where the first resistance is less than the second resistance.

The ESD recording circuit 400 also includes shunting circuitry to shunt energy away from the first memristive element 410. In some instances, the shunting circuitry includes a first primary PMOS (p-channel meta oxide-semiconductor) transistor 412, a second primary NMOS (n-channel metal-oxide-semiconductor) transistor 413, a first secondary PMOS transistor 414, and a second secondary NMOS transistor 415. A first terminal of the first memristive element 410 and a first terminal of the first resistive element 411 are coupled at a first node 401, and a second terminal of the first memristive element 410 and a second terminal of the first resistive element 411 are coupled at a second node 402. The chip pin is coupled to the first node 401 via the bond pad 405.

A first gain terminal of the first primary PMOS transistor 412 and a second, drain terminal of the second primary NMOS transistor 413 are coupled to the first node 401, a first gate terminal and a first source terminal of the first primary PMOS transistor 412 are coupled to a first voltage, and a second gate terminal and a second source terminal are coupled to a second voltage.

A third drain terminal of the first secondary PMOS transistor 414 and a fourth drain terminal of the second secondary NMOS transistor 415 are coupled to, the second node 402. A third gate terminal and a third source terminal of the first secondary PMOS transistor 414 are coupled to the first voltage, and a second gate terminal and a second source terminal of the second secondary NMOS transistor 415 are coupled to the second voltage.

Internal circuits 407 of the integrated circuit to be protected from the ESD event are coupled to the second node 402. Also, the first primary PMOS transistor 412 and the second primary NMOS transistor 413 are larger than the first secondary PMOS transistor 414 and the second secondary NMOS transistor 415, such that the first primary PMOS transistor 412 and the second primary NMOS transistor 413 turn on slower than the first secondary PMOS transistor 414 and a second secondary NMOS transistor 415 when an ESD event occurs at the pin.

As with the ESD recording circuits discussed in FIGS. 1 and 2, the first memristive element 410 of FIG. 4 is initially set to a LRS. Similarly to the circuits of FIGS. 1 and 2, when an ESD event occurs at bond pad 405, current flows through the first memristive element 410 and the current-limiting first resistive element 411, causing a voltage drop $V_R$ to be generated across these elements 410, 411. The voltage $V_R$ switches the first memristive element 410 from the LRS to the HRS. As a result, most of the current flow is shunted through the first resistive element 411.

The secondary ESD transistors 414, 415 are physically smaller than the primary ESD transistors 412, 413, and thus have less capacitance and take less time to turn on. Thus, early in the occurrence of the ESD event, the secondary ESD transistors 414, 415 begin to absorb some of the current flowing through the first resistive element 411, prior to the primary ESD transistors 414, 415 turning on. The current-limiting first resistive element 411 protects the internal circuits 407 from the highest voltages while waiting for the primary ESD transistors 414, 415 to turn on. When the primary ESD transistors 414, 415 turn on, they shunt most of the energy from the ESD pulse.

Figure 5:
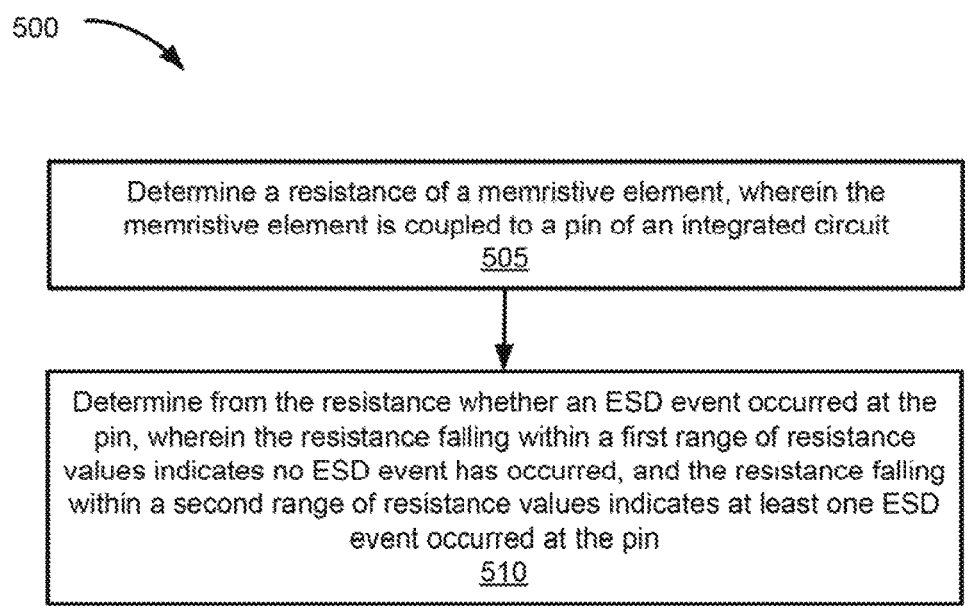
FIG. 5 depicts a flow diagram illustrating an example process of determining whether an electrostatic event occurred at a pin of an integrated circuit.

FIG. 5 depicts a flow diagram illustrating an example process 500 of determining whether an ESD event occurred at a pin of an integrated circuit.

The process begins at block 505, where a resistance of a memristive element may be determined. The memristive element may be coupled to a pin of an IC, for example, via a bond pad.

At block 510, it may be determined from the resistance whether an ESD event occurred at the pin. When the determined resistance falls within a first range of resistance values, the resistance indicates that no ESD event has occurred. The first range of resistance values may be values near the LRS of the memristive element. When the resistance falls within a second range of resistance values, the resistance indicates at least one ESD event occurred at the pin. The second range of resistance values may be values near the HRS of the memristive element.

In some examples, values within the first range of resistance values are less than values within the second range of resistance values. In some implementations, the memristive element may be coupled in parallel to a resistive element having a resistance value greater than the first range of resistance values and less than the second range of resistance values.

Figure 6:
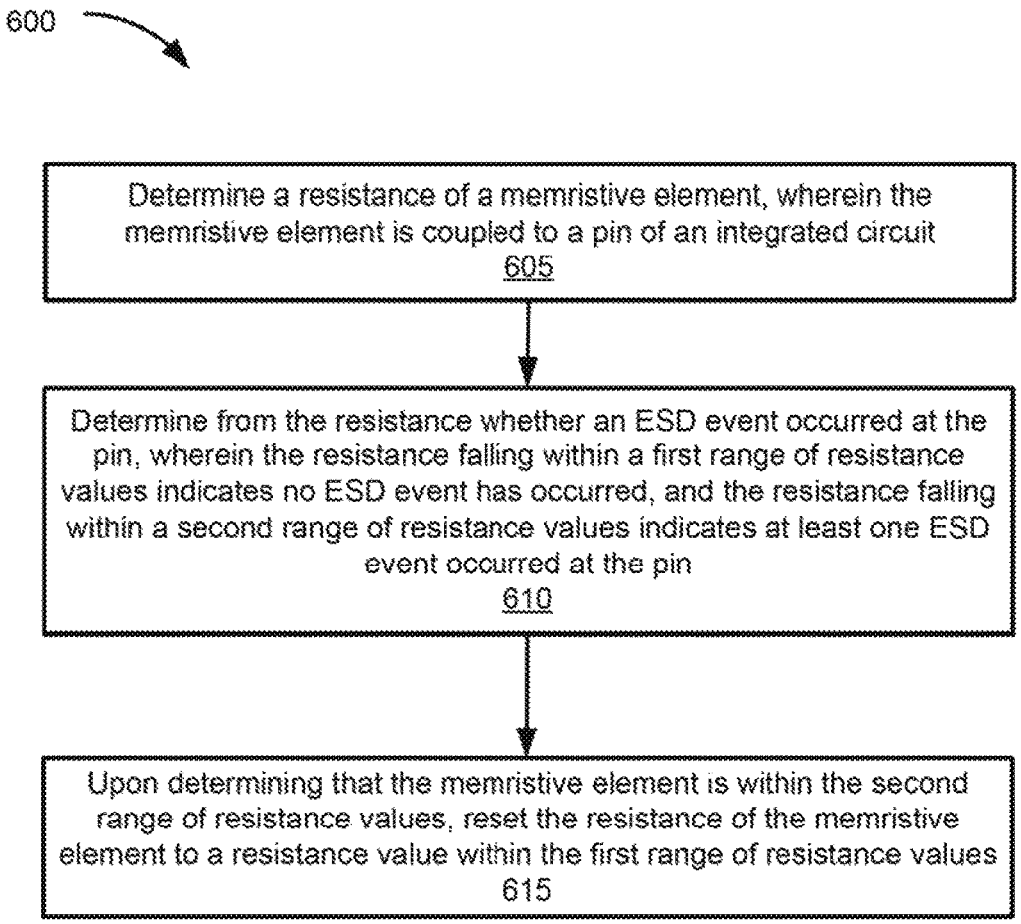
FIG. 6 depicts a flow diagram illustrating an example process of determining whether an electrostatic event occurred at a pin of an integrated circuit.

FIG. 6 depicts a flow diagram illustrating an example process 600 of determining whether an ESD event occurred at a pin of an integrated circuit. The process begins at block 605, which may be similar to block 505 described with respect to the process 500 of FIG. 5. Block 610 may also be similar to block 510 of FIG. 5.

At block 615, upon determining that the resistance of the memristive element is thin the second range of resistance values, the resistance of the memristive element may be reset to a resistance value within the first range of resistance values. For example, if the memristive element has switched from the LRS to the HRS due to the occurrence of an ESD event, the memristive element may be reset to the LRS to detect and record the occurrence of another ESD event.

Figure 7:
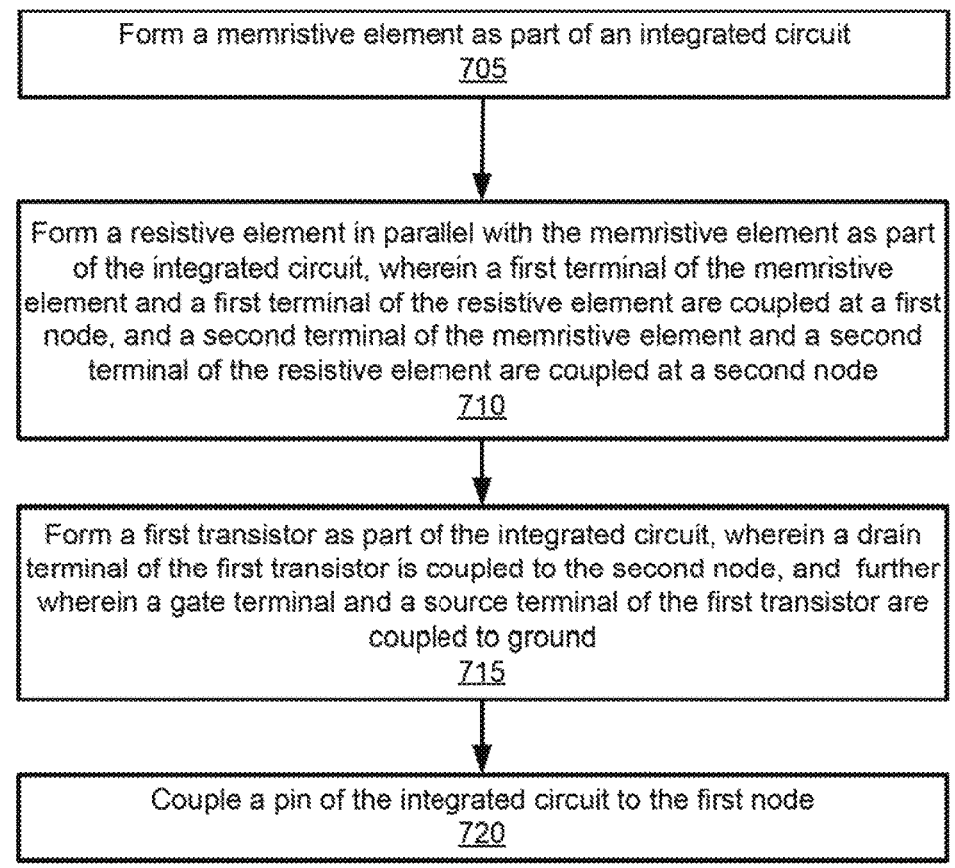
FIG. 7 depicts a flow diagram illustrating an example process of manufacturing a memristive element as part of an integrated circuit for detecting whether an electrostatic event occurred at a pin of the integrated circuit.

FIG. 7 depicts a flow diagram illustrating an example process 700 of manufacturing a memristive element as part of an integrated circuit for detecting whether an ESD event occurred at a pin of the integrated circuit.

The process beings at block 705, where a memristive element may be formed as part of an integrated circuit. In some examples, the memristive element may further be coupled to a pin of the IC via a bond pad.

At block 710, a resistive element may be formed in parallel with the memristive element as part of the IC. A first terminal of the memristive element and a first terminal of the resistive element may be coupled at a first node. Additionally, a second terminal of the memristive element and a second terminal of the resistive element may be coupled at a second node.

At block 715, a first transistor may be formed as part of the IC. A drain terminal of the first transistor may be coupled to the second node. Also, a gate terminal and a source terminal of the first transistor may be coupled to ground.

At block 720, a pin of the IC may be coupled to the first node via a bond pad. Each pin of the IC may be coupled to a separate memristive element, or even multiple memristive elements, to detect and record the occurrence of an ESD event at each pin. The elements formed in process 700 may be formed, for example, as memristive element 210, resistive element 215, and transistor 211 as shown in FIG. 2.

FIG. 8 depicts a flow diagram illustrating'an example process 800 of manufacturing a memristive element as part of an integrated circuit for detecting whether an ESD event occurred at a pin of the integrated circuit. The process begins at block 805, which may be similar to block 705 described with respect to the process 700 of FIG. 7. Blocks 810, 815, and 820 may also be similar to blocks 710, 715, and 720, respectively, of FIG. 7.

At block 625, a second transistor may be formed as part of the integrated circuit, where a drain terminal of the second transistor may be coupled to the second node. Also, a gate terminal and a source terminal of the second transistor may be coupled to ground. The elements formed in process 800 may be formed, for example, as memristive element 210, resistive element 215, transistor 211 and transistor 212 as shown in FIG. 2.

Not all of the steps, or features presented above are used in each implementation of the presented techniques. Further, steps in processes 500-800 may be performed in a different order than presented.

As used in the specification and claims herein, the singular forms "a," "an," and "the" include plural referents unless the context clearly dictates otherwise.

What is claimed is:

1. An electrostatic discharge (ESD) recording circuit comprising:
    a first memristive element coupled to a pin of an integrated circuit, wherein the first memristive element switches from a first resistance to a second resistance when an ESD event occurs at the pin, wherein the first resistance is less than the second resistance; and
    shunting circuitry to shunt energy from an additional ESD event away from the first memristive element.

2. The ESD recording circuit of claim 1, further comprising an electrical writing circuit to apply a reset voltage to the first memristive element to reset the first memristive element to the first resistance.

3. The ESD recording circuit of claim 1, further comprising an electrical reading circuit to determine a resistance of the first memristive element.

4. The ESD recording circuit of claim 1, wherein the shunting circuitry comprises a first resistive element in parallel with the first memristive element that has a third resistance greater than the first resistance and less than the second resistance, and further wherein a resistance of the first memristive element is maintained at the second resistance after switching from the first resistance until the resistance is reset to the first resistance.

5. The ESD recording circuit of claim wherein the shunting circuitry comprises a first resistive element in parallel with the first memristive element that has a third resistance greater than the first resistance and less than the second resistance, and the ESD recording circuit further comprises a first transistor,
    wherein a first terminal of the first memristive element and a first terminal of the first resistive element are coupled at a first node, and a second terminal of the first memristive element and a second terminal of the first resistive element are coupled at a second node,
    wherein the pin and circuitry of the integrated circuit to be protected from the ESD event are coupled to the first node,
    wherein a first drain terminal of the first transistor is coupled to the second node, and
    further wherein a first gate terminal and a first source terminal to the first transistor are coupled to ground.

6. The ESD recording circuit of claim 5, further comprising a second transistor,
    wherein a second drain terminal of the second transistor is coupled to the second node, and
    further wherein a second gate terminal and a second source terminal of the second transistor are coupled to ground.

7. The ESD recording circuit of claim 5, further comprising a second memristive element, a second resistive element, and a third transistor,
    wherein the second memristive element and the second resistive element are in parallel and coupled to the first node and a third node,
    wherein a third drain terminal of the third transistor is coupled to the third node, and
    further wherein a third gate terminal and a third source terminal of the third transistor are coupled to ground.

8. The ESD recording circuit of claim 1, wherein the shunting circuitry comprises a first resistive element in parallel with the first memristive element that has a third resistance greater than the first resistance and less than the second resistance, and the ESD recording circuit further comprises a capacitor and a transistor,
    wherein a first terminal of the first memristive element and a first terminal of the first resistive element are coupled at a first node, and a second terminal of the first memristive element and a second terminal of the first resistive element are coupled at a second node, and the second node is coupled to ground,
    wherein a first terminal of the capacitor and a gate terminal of the transistor are coupled to the first node,
    wherein the source terminal of the transistor is coupled to ground, and the drain terminal of the transistor is coupled to a second terminal of the capacitor at a third node,
    wherein the pin and circuitry of the integrated circuit to be protected from the ESD event are coupled to the third node.

9. The ESD recording circuit of claim 1, further comprising a first primary PMOS (p-channel metal-oxide-semiconductor) transistor, a second primary NMOS (n-channel metal-oxide-semiconductors transistor, a first secondary PMOS transistor, and a second secondary NMOS transistor,
    wherein a first terminal of the first memristive element and a first terminal of the first resistive element are coupled at a first node, and a second terminal of the first memristive element and a second terminal of the first resistive element are coupled at a second node, wherein the pin is coupled to the first node, wherein a first drain terminal of the first primary PMOS transistor and a second drain terminal of the second primary NMOS transistor are coupled to the first node, a first gate terminal and a first source terminal of the first primary PMOS transistor are coupled to a first voltage, and a second gate terminal and a second source terminal are coupled to a second voltage, wherein a third drain terminal of the first secondary PMOS transistor and a fourth drain terminal of the second secondary NMOS transistor are coupled to the second node, a third gate terminal and a third source terminal of the first secondary PMOS transistor are coupled to the first voltage, and a second gate terminal and a second source terminal or the second secondary NMOS transistor are coupled to the second voltage, and wherein circuitry of the integrated circuit to be protected from the ESD event is coupled to the second node, and further wherein the first primary PMOS transistor and the second primary NMOS transistor are larger than the first secondary PMOS transistor and the second secondary NMOS transistor, such that the first primary PMOS transistor and the second primary NMOS transistor turn on slower than the first secondary PMOS transistor and a second secondary NMOS transistor when the ESD event occurs at the pin.

10. A method comprising:

determining a resistance of a memristive element, wherein the memristive element is coupled to a pin of an integrated circuit; and determining from the resistance whether an ESD event occurred at the pin, wherein the resistance falling within a first range of resistance values indicates no ESD event has occurred, and the resistance falling within a second range of resistance values indicates at least one ESD event occurred at the pin.

11. The method of claim 10, further comprising upon determining that the resistance of the memristive element is within the second range of resistance values, resetting the resistance of the memristive element to a resistance value within the first range of resistance values.

12. The method of claim 10, wherein values within the first range of resistance values are less than values within the second range of resistance values.

13. The method of claim 10, wherein the memristive element is coupled in parallel to a resistive element having a resistance value greater than the first range of resistance values and less than the second range of resistance values.

14. A method comprising:

manufacturing a memristive element as part of an integrated circuit;

manufacturing a resistive element in parallel with the memristive element as part of the integrated circuit, wherein a first terminal of the memristive element and a first terminal of the resistive element are coupled at a first node, and a second terminal of the memristive element and a second terminal of the resistive element are coupled at a second node;

manufacturing a first transistor as part of the integrated circuit, wherein a drain terminal of the first transistor is coupled to the second node, and further wherein a gate terminal and a source terminal of the first transistor are coupled to ground; and coupling a pin of the integrated circuit to the first node.

15. The method of claim 14, further comprising manufacturing a second transistor as part of the integrated circuit, wherein a drain terminal of the second transistor is coupled to the second node, and further wherein a gate terminal and a source terminal of the second transistor are coupled to ground.

* * * * *